United States Patent
Peters et al.

(10) Patent No.: US 8,102,012 B2
(45) Date of Patent: Jan. 24, 2012

(54) TRANSISTOR COMPONENT HAVING A SHIELDING STRUCTURE

(75) Inventors: Dethard Peters, Hoechstadt (DE); Peter Friedrichs, Nuremberg (DE); Rudolf Elpelt, Erlangen (DE); Larissa Wehrhahn-Kilian, Erlangen (DE); Michael Treu, Villach (AT); Roland Rupp, Lauf (DE)

(73) Assignee: Infineon Technologies Austria AG, Villach (AU)

( * ) Notice: Subject to any disclaimer, the term of this patent is extended or adjusted under 35 U.S.C. 154(b) by 286 days.

(21) Appl. No.: 12/426,008

(22) Filed: Apr. 17, 2009

(65) Prior Publication Data

US 2010/0264467 A1    Oct. 21, 2010

(51) Int. Cl.
*H01L 27/088* (2006.01)
(52) U.S. Cl. .......... 257/401; 257/E29.318; 257/E29.262
(58) Field of Classification Search .................. 257/401, 257/495, E29.338, E29.342, E29.318, E29.262
See application file for complete search history.

(56) References Cited

U.S. PATENT DOCUMENTS

| | | | |
|---|---|---|---|
| 4,984,049 A | | 1/1991 | Nishizawa et al. |
| 7,576,388 B1 * | | 8/2009 | Wilson et al. .................. 257/330 |
| 7,825,430 B2 * | | 11/2010 | Terashima ..................... 257/140 |
| 2004/0245597 A1 * | | 12/2004 | Tihanyi ......................... 257/500 |

FOREIGN PATENT DOCUMENTS

WO    2008156674 A1    12/2008

OTHER PUBLICATIONS

"4H-SiC VJFET Based Normally-off Cascode Switches for 300° C Electronic Applications", Victor Veliadis, et al., Northrop Grumman Electronic Systems, 2008 SAE International.

* cited by examiner

*Primary Examiner* — Caridad Everhart
(74) *Attorney, Agent, or Firm* — Dicke, Billig & Czaja, PLLC (57) ABSTRACT

A transistor component having a shielding structure. One embodiment provides a source terminal, a drain terminal and control terminal. A source zone of a first conductivity type is connected to the source terminal. A drain zone of the first conductivity type is connected to the drain terminal. A drift zone is arranged between the source zone and the drain zone. A junction control structure is provided for controlling a junction zone in the drift zone between the drain zone and the source zone, at least including one control zone. A shielding structure is arranged in the drift zone between the junction control structure and the drain zone and at least includes a shielding zone of a second conductivity type being complementarily to the first conductivity type. The shielding zone is connected to a terminal for a shielding potential. The at least one control zone and the at least one shielding zone have different geometries or different orientations in a plain that is perpendicular to a current flow direction of the component.

36 Claims, 6 Drawing Sheets

TRANSISTOR COMPONENT HAVING A SHIELDING STRUCTURE

BACKGROUND

Disclosed is a transistor component, in one embodiment a transistor component that is controllable using a junction effect.

Transistor components that are controllable using a junction effect are, for example, junction FETs (FET=FIELD EFFECT TRANSISTOR) or JFETs (JFET=JUNCTION FET) or MESFETs (MESFET=METAL SEMICONDUCTOR FET). These components each include a source and a drain terminal that are connected to a source zone and a drain zone and form load path terminals, and a gate terminal as a control terminal. The gate terminal serves for controlling a junction zone between the drain and the source terminal, and therefore serves for controlling the conduction behavior of the component. For controlling the junction zone a JFET includes a pn-junction between the gate terminal and the source zone, and a MESFET includes a Schottky junction between the gate terminal and the source zone for controlling this junction zone.

A power transistor component includes a drift zone between the source zone and the drain zone, the drift zone being doped lower than the source zone and the drain zone and, at blocking component, serves for absorbing a blocking voltage that is applied to the component. For blocking the component a control voltage (drive voltage) is applied between the gate terminal and the source terminal, this control voltage being selected such that the junction zone completely pinches off a conducting channel between the source zone and the drain zone.

In such transistor component that are controllable using a junction effect a blocking voltage applied to the component may influence the control voltage that is necessary for blocking the component, where with increasing blocking voltage the control voltage necessary for blocking the component increases.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a transistor component, including: a source terminal, a drain terminal and a control terminal. A source zone of a first conduction type is connected to the source terminal. A drain zone of the first conduction type, is connected to the drain terminal. A drift zone is arranged between the source zone and the drain zone. A junction control structure is provided for controlling a junction zone in the drift zone between the drain zone and the source zone. A shielding structure is arranged in the drift zone between the junction control structure and the drain zone, and including at least one shielding zone of a second conduction type that is complementarily to the first conduction type. The fielding zone is coupled to a terminal for a shielding potential.

Figure 1:
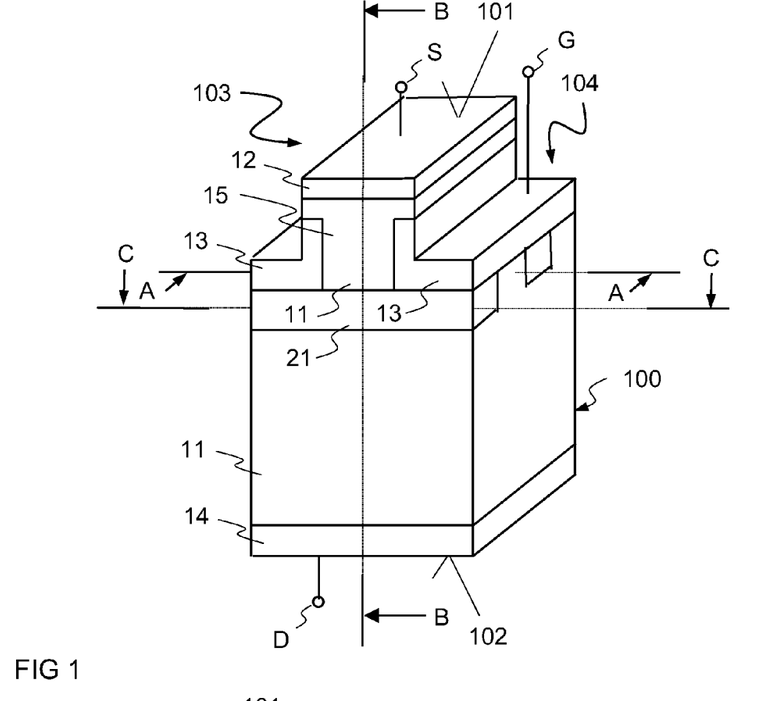
FIG. 1 illustrates one embodiment of a transistor component being controllable using a junction effect.
Figure 2:
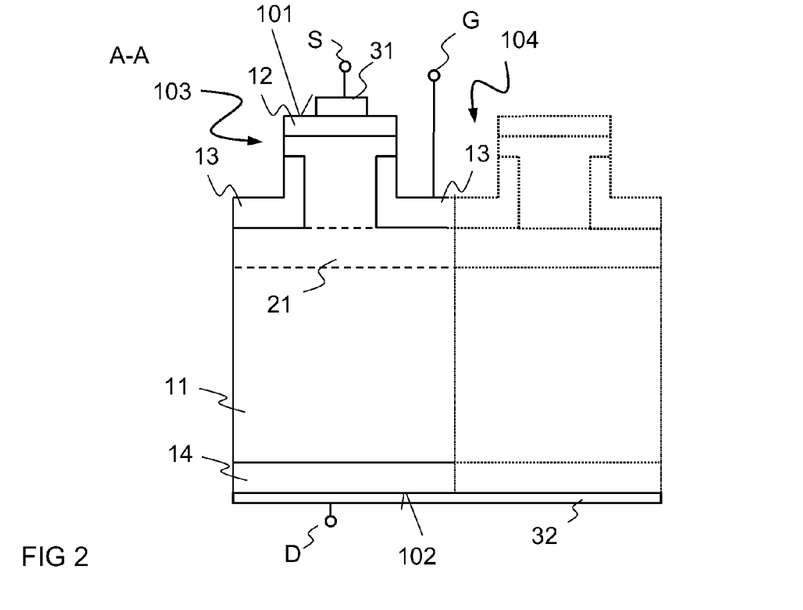
FIG. 2 is a cross section in a first vertical section plane illustrating the transistor component of FIG. 1.
Figure 3:
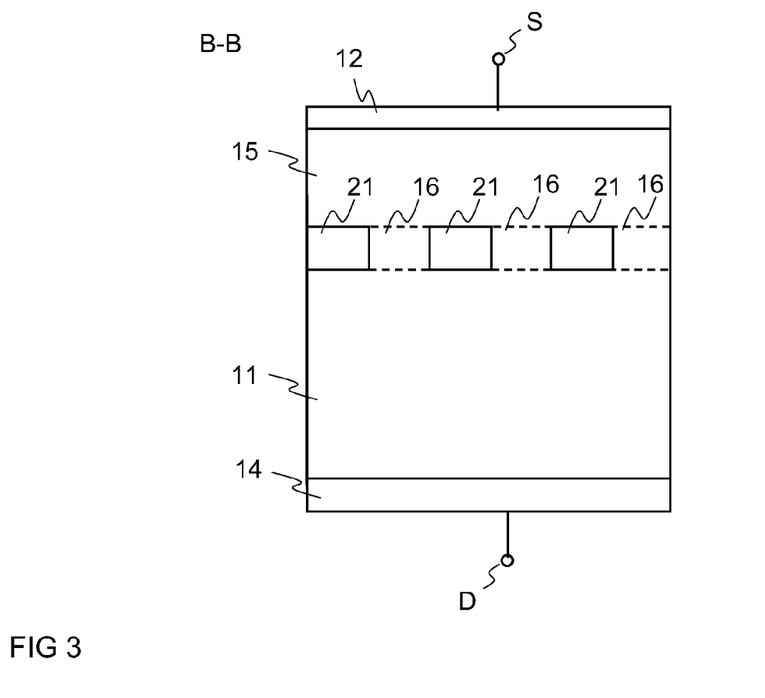
FIG. 3 is a cross section in a second vertical section plane illustrating the component of FIG. 1.
Figure 4:
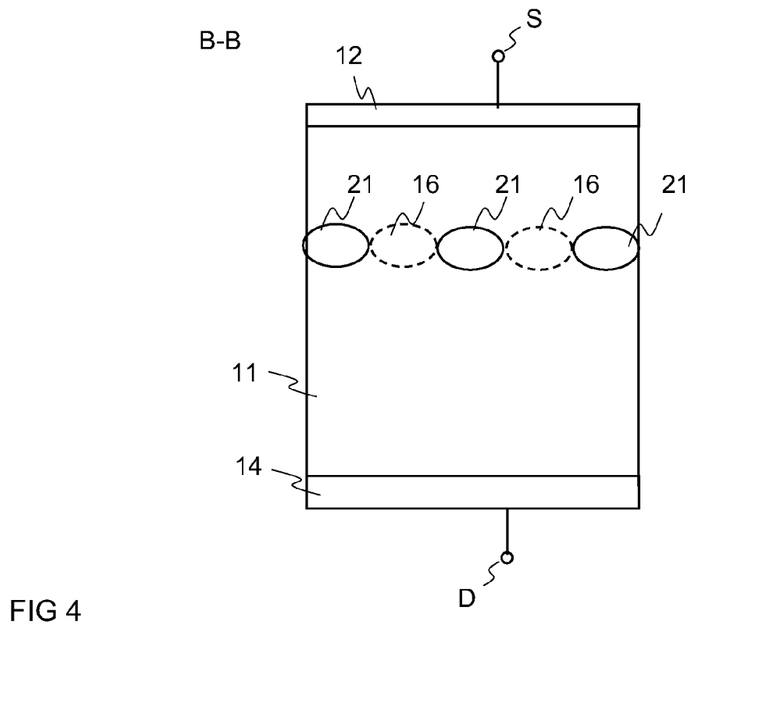
FIG. 4 is a cross section in the second vertical section plane, illustrating one embodiment of a component being modified as compared to the component in FIG. 1.

FIGS. 1 to 3 illustrate one embodiment of a semiconductor or integrated circuit including a transistor component being controllable using a junction effect. FIG. 1 illustrates the component by way of a perspective cross section through a semiconductor body 100 in which component zones of the transistor component are integrated. FIG. 2 illustrates the component by way of a cross section in a first vertical section plane A-A of the semiconductor body 100, and FIG. 3 illustrates the component by way of a cross section in a second vertical section plane B-B, the second vertical section plane running perpendicular to the first section plane A-A in the present example.

The component includes in the semiconductor body 100 a drift zone 11 of a first conductivity type, arranged between a source zone 12 and a drain zone 14 of the first conductivity type. The drift zone 11 is doped lower than the source zone 12 and the drain zone 14.

The component as illustrated is a vertical component. Source zone 12 and drain zone 14 are there arranged distant to one another in a vertical direction of the semiconductor body 100. In the embodiment illustrated, source zone 12 is arranged in a region of a first side of the semiconductor body 100 and drain zone 14 is arranged in the region of a second side 102 of the semiconductor body 100, the second side 102 being opposed to the first side 101. The first side 101 of the semiconductor body 100 will be referred to as front side in the following, and the second side 102 will be referred to as rear side of the semiconductor body 100 in the following. The semiconductor body 100 may be comprised of any semiconductor material, like, for example, silicon (Si), silicon carbide (SiC) or gallium nitride (GaN).

The transistor component further includes a source terminal S, being connected to the source zone 12, and a drain terminal D being connected to the drain zone 14. In FIGS. 1 and 3 these source and drain terminals S, D are only schematically illustrated. As illustrated in FIG. 2 source and drain terminals S, D may include terminal contacts or terminal metallization 31, 32, respectively, being arranged at the front and rear side 101, 102 of the semiconductor body 100. In one embodiment, the terminal metallization 31. 32 may be multi layer metallization having several different layers. An example of a multi layer terminal electrode is a terminal electrode having a layer of a silicide, like SiNi, arranged directly on the semiconductor body, and a layer stack with several further layers arranged on the first layer, like a layer stack or layer system, respectively, having the following layers: nickel-silicide (NiSi), having a thickness of, for example, about 40 nm; titanium (Ti) having a thickness of, for example, about 10 nm; nickel (Ni) having a thickness of, for example, about 1000 nm; titanium (Ti) having a thickness, for example, about 10 nm; and silver (Ag) having a thickness of, for example, about 200 nm.

The transistor component may be used as a switching element or as a part of a switching element for switching an electrical load. For controlling a conducting state (on-state) and a blocking state (off-state), the transistor component includes a junction control structure configured to control a junction zone in the drift zone 11 between the source zone 12 and the drain zone 14. This junction control structure includes a gate terminal G for applying a control potential and—in the example as illustrated—a gate zone 13 that is of a second conductivity type which is complementarily to a first conductivity type, gate zone 13 being arranged in the drift zone 11, and forming a control zone. This gate zone 13 may be arranged distant to the source zone 12, this is illustrated in FIG. 1 by way of solid lines.

In a manner not illustrated in detail, source zone 12 and gate zone 13 may be realized such that they adjoin one another. However, in this embodiment a "hard pn-junction" between source zone 12 and gate zone 13 resulting from this is configured to absorb the control voltage to be applied to gate zone 13.

In the embodiment illustrated, the semiconductor body 100 includes a head section, which is also referred to as mesa region, this mesa region being formed in that the semiconductor body includes trenches 104 that extend in a vertical direction into the semiconductor body 100 starting from the front side 101. This head section 103 includes side walls, being formed by side walls of the trenches 104. These side walls—as illustrated—may be parallel to another and may extend in the vertical direction of the semiconductor body 100. However, these side walls may also be tapered as compared to the vertical direction of the semiconductor body (not illustrated). As illustrated, gate zone 13 may be arranged at opposing side walls of the head section 103, however, in one embodiment it is arranged in the region of only one of the sidewalls of the head section 103 (not illustrated).

Gate zone 13 may, as illustrated, be also arranged in the region of the bottom of the trenches 104 that define the head section 103. A region of the drift zone arranged in the head section will be referred to as channel region or channel zone 15 respectively, of the drift zone 11. In the embodiment illustrated the channel region is arranged adjacent to the gate zone 13 in a lateral direction of the semiconductor body 100 or is arranged between two sections of the gate zone that are distant to one another in the lateral direction, respectively.

The channel region 15 of the drift zone 11 may be higher doped than the remaining region of the drift zone 11, i.e., than that region of the drift zone 11 which in the direction of the drain zone 14 is arranged below the shielding zone 21. The doping concentration of the drift zone 11 in the region below the shielding zone 21 is, for example, in the range between $5 \cdot 10^{14}$ (5E14) $cm^{-3}$ and $5 \cdot 10^{16}$ (5E16) $cm^{-3}$ if SiC is used as the semiconductor material. If Si is used as the semiconductor material this doping concentration as compared to the doping concentration for SiC is smaller for about two orders, i.e., for about factor $10^2$. The doping concentrations of source zone 12 and drain zone 14 are, for example, in the range between $5 \cdot 10^{17}$ (5E17) $cm^{-3}$ and $5 \cdot 10^{19}$ (5E19) $cm^{-3}$ for Si as well as SiC.

The vertical transistor component illustrated in FIGS. 1 to 3 is a vertical junction FET (VJFET). The component may be an n-conducting component. In this case drift zone 11, source zone 12 and drain zone 14 are n-doped and the gate zone 13 is p-doped. The component may also be a p-conducting component. In this case drift zone 11, source zone 12 and drain zone 14 are p-doped, and the gate zone 14 is n-doped. The functionality of the basic structure explained so far having drift zone 11, source zone 12, drain zone 14 and gate zone 13 is now explained for the example of an n-conducting component. In an equivalent manner these explanations do also apply to a p-conducting component, where in this case the polarity of the voltages and potentials, respectively, that will be explained are to be inverted.

The component conducts as long as the pn-junction between gate zone 30 and channel zone 15 is polarized such that starting from this pn-junction a significant junction zone or depletion zone, respectively, does not form in the channel zone 15. This is particularly the case, if the control potential, i.e., the electrical potential at gate terminal G, corresponds to source potential, i.e., the electrical potential at source terminal S. This equivalent to the gate-source-voltage, i.e., the voltage between the gate terminal G and source terminal S, being zero. The component starts to block, if the gate potential falls below the source potential or if the source potential rises above the gate potential, respectively. In this case starting from the pn-junction between the gate zone 13 and the channel zone 15 a junction layer or depletion layer respectively, propagates in the channel zone 15. The component blocks completely, if the junction zone propagating from one gate zone section 13 in a lateral direction reaches the junction zone extending from a gate zone section 13 being arranged on the opposite side, or if the junction zone propagating from one gate zone section 13 reaches an opposed sidewall of the head section 103, respectively. A charge carrier current between source zone 12 and drain zone 14 across the junction layer is, except for a small temperature-dependent leakage current, almost completely suppressed.

With increasing blocking voltage, i.e., with increasing positive voltage between drain terminal D and source terminal S, the space charge region in the drift zone 11 starting from the head region 103 propagates further in the direction of the drain zone 14, i.e., the electrical field at the pn-junctions between the gate zone 13 and the drift zone 11 increases with increasing blocking voltage. A maximum voltage blocking capability of the component is reached, if the electrical field reaches a critical value, the breakdown field strength, for which an impact ionization or an avalanche multiplication in the drift zone 11 begins, through which charge carriers are generated in an uncontrolled manner so that the component breaks through.

The voltage blocking capability of the component is significantly influenced by the doping concentration of the drift zone 11 and its dimension in the current flow direction, which is the vertical direction of the semiconductor body in the present example. For silicon as a material for the semiconductor body 100 as a rule of thumb a dimension of 10 µm of the drift zone for each 100V voltage blocking capability is required. In SiC as a semiconductor material the breakdown field strength is ten times higher than in silicon. In an SiC component, that has the same voltage blocking capability than a corresponding Si component, the length of the drift zone may be ten times smaller than the length of the drift zone of the Si component.

Unless additional measures are taken, the load path voltage applied between drain terminal D and source terminal S influences the "blocking control voltage" to be applied between gate G and source S. In the following the "blocking control voltage" is the voltage to be applied between gate G and source S in order to obtain a complete blocking of the transistor component.

One measure to avoid or at least reduce this dependency of the blocking control voltage from the load path voltage applied between the drain D and source S is to provide a shielding structure that is arranged in the drift zone 11 between drain zone 14 and the junction control structure. This shielding structure includes at least one shielding zone 21 of the second conductivity type, that is complementarily to the first conductivity type, and is coupled to a shielding potential. In the component illustrated in FIGS. 1 to 3 the shielding potential is the gate potential. In this component connecting the shielding zone 21 to the gate potential is obtained in that shielding zone 21 adjoins gate zone 13 in the vertical direction of the semiconductor body 100.

The shielding structure and the at least one gate zone are, for example, realized in such a manner as to have different geometries or different orientations in a plane perpendicular to a current flow direction of the component. In the component as illustrated the plane running perpendicular to the current flow direction is a horizontal plane of the semiconductor body.

In one or more embodiments illustrated in FIGS. 1 to 3 the shielding structure has a strip-like geometry including several strip-shaped shielding zones 21 that are distant to one another and between which regions of the drift zone 11 are arranged.

In the region of spaces of the shielding structure the drift zone 11 optionally includes semiconductor zones 16 of the first conductivity type that may be doped higher or lower than drift zone 11 in regions below the shielding zones. The shielding effect is the higher the lower these semiconductor zones 16 are doped or the smaller the dimensions of this semiconductor zones are in a lateral direction, respectively. However, with reducing the doping and the lateral dimensions the on-resistance increases. Doping and dimensions of the semiconductor zones 16 may be optimized in consideration of the desired shielding effect and the desired on-resistance.

The functionality of the shielding structure and the influence of the shielding structure on the functionality of the transistor component, respectively, will be explained in the following. If the transistor component blocks so that a junction zone propagates in the channel zone 16, then the regions of the drift zone 11 that surround the shielding zone 21 have an electrical potential that corresponds to source potential or that is even higher than source potential—if the component is an n-conducting component and a positive voltage is applied between drain and source D, S. Starting from the pn-junction between the shielding zone 21 and the surrounding regions of the drift zone 11 a junction zone propagates in the drift zone 11 in the direction of the drain zone D. The pn-junctions between the shielding zones 21 and drift zone 11 absorb a major part of the electrical field that forms in the drift zone 11, if a blocking voltage is applied. In other words: ionized doping atoms, that are present in the drift zone 11, if the component blocks, find a counter-charge in complementarily ionized doping atoms of the shielding zones 21. A major part of the ionized doping atoms of drift zone 11 are, therefore, "compensated" by doping atoms of the shielding zones 21. Thus, the gate zones 13 in the head region 103 need to compensate less ionized doping atoms of the drift zone 11, resulting in the electrical field being reduced as compared to conventional components.

Given a vertical channel structure, present in the components illustrated in the figures, the control voltage is usually dependent on the blocking voltage and heavily dependent on the width of the mesa regions, and it is therefore heavily dependent on such process tolerances that influence the width of the mesa regions. In the components as illustrated shielding zones 21 already absorb a major part of the electrical field, the head structure 103 is, therefore, less sensitive to the cited influences. The component may be considered as a combination (serial circuit) of a low voltage FET, being formed by the head structure, and a high voltage FET, both FETs being self-conducting FETs. Additionally dimensioning of the shielding zones 21 and the head structure 103 may be adjusted independently from one another.

Shielding zones 21 and the optionally present higher doped zones 16 in the vertical section plane may have a substantially rectangular-shaped cross section—as it is illustrated in FIGS. 1 and 3. However, this is only an example. It goes without saying that these doped semiconductor zones 21, 16 may have any cross section, like, for example, elliptical or circular cross section, as it is illustrated in FIG. 1 by way of a vertical cross section in the section plane B-B.

As it is schematically illustrated in FIG. 2, the component may be realized in a cellular manner and may include a plurality of the structures explained with reference to FIG. 1 that include head sections 103 as well as source zones 12 and gate zones 13 in these head sections. Each head section 103 having a source zone 12, a gate zone 13 and a channel zone 15 is part of a transistor cell. These transistor cells are connected in parallel in that their source zones 12 are electrically conducting connected with each other or are connected to a common source terminal, respectively, and in that their gate zones 13 are electrically conducting connected with each other or are connected to a common gate terminal, respectively. Drain zone 14 as well as a region of the drift zone that lies below the head section 103 is common to all transistor cells. These transistor cells may be realized as strip-cells. In this case source zone 12 and gate zone 13 are strip-shaped doped semiconductor zones that extend in a lateral direction of the semiconductor body. In this case head section 103 is a strip-shaped elevation or is a strip-shaped mesa region of the semiconductor body 100, respectively. Head section 103 may also be pile-shaped having a rectangular or any other cross section in horizontal direction (not illustrated). Source zone 12 and gate zone 13 in this case have a geometry that is configured to the geometry of the head section.

In strip-shaped transistor cells and strip-shaped shielding zones 21 the transistor cells in the shielding zones 21 are particularly aligned to one another that for strip-shaped transistor cells the strip-shaped source zone 13 and the shielding zones 21 include an angle other than zero. In this embodiment gate zone 13 and the shielding zones 21 each have a similar, namely strip-shaped geometry, but different lateral orientations.

Figure 5:
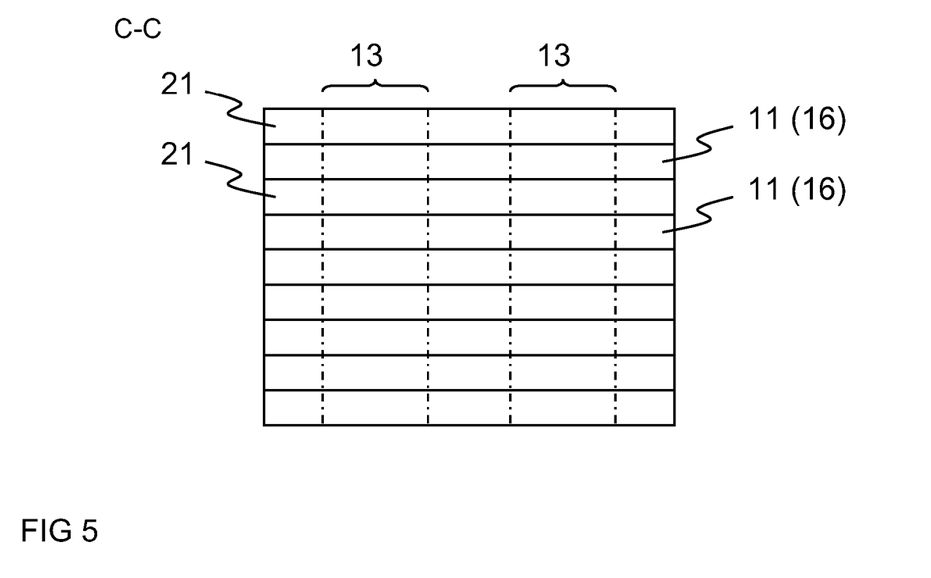
FIG. 5 is a cross section in a horizontal section plane illustrating the component of FIG. 1.

By way of a horizontal cross section in a section plane C-C FIG. 5 illustrates an example of a transistor component having strip-shaped transistor cells and strip-shaped shielding zones, with the source zone 13 and the shielding zones 21 including a right angle. In this connection it should be noted that providing a right angle is only an example. It goes without saying that any other angles other than 0°, and particularly larger than 30°, may be present between the source zones 13 and the strip-shaped shielding zones 21, as it is illustrated with reference to a further example in FIG. 6.

Figure 6:
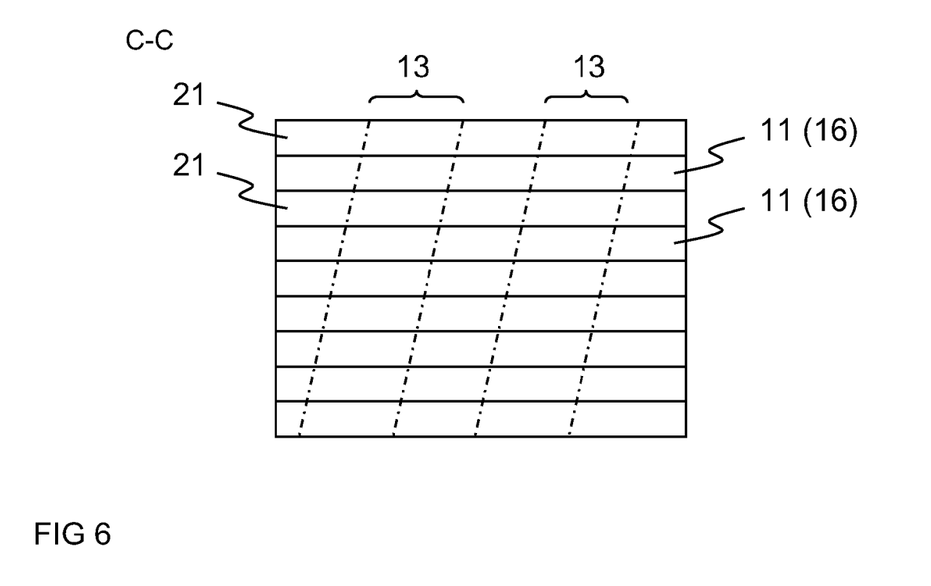
FIG. 6 is a cross section in the horizontal section plane, illustrating one embodiment of a component being modified as compared to the component in FIG. 1.

FIG. 6 illustrates a transistor component by way of a vertical cross section through the semiconductor body in the section plane C-C, in this component between the source zones 13 and the shielding zones 21 an angle between 0° and 90° is present.

Realizing the at least one gate zone 13 and the shielding zones 21 in that they have different geometries or different lateral orientations, reduces the "free channel cross section" of the drift zone 11, i.e., the cross section in which drift zone 11 in vertical direction goes through from drain zone 14 to source zone 12. In this way an improved blocking behavior is achieved, the blocking behavior being influenced by gate zone 13 as well as by shielding zones 21, as it has been explained.

Figure 7:
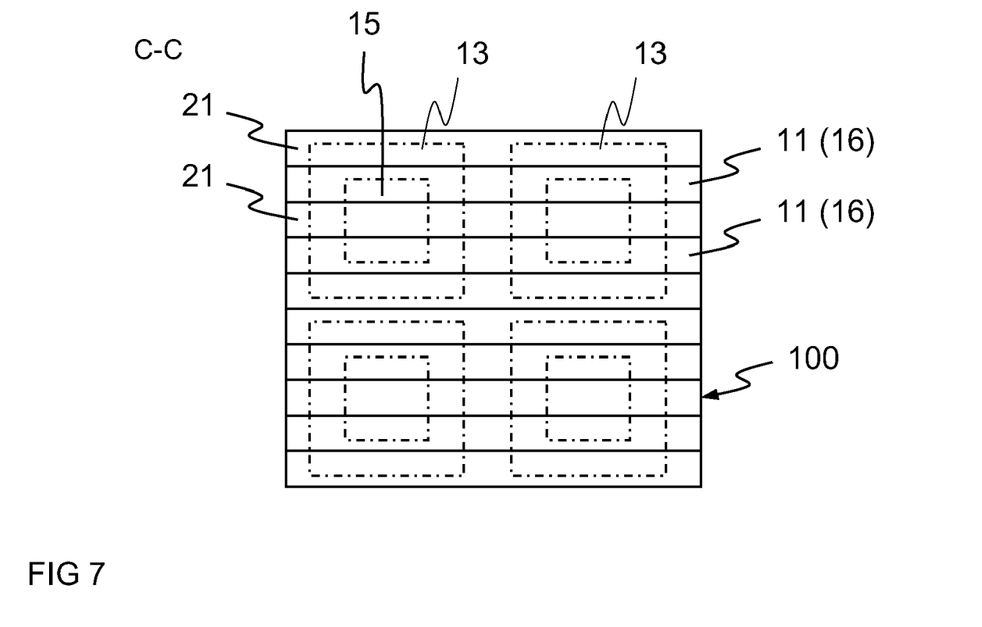
FIG. 7 is a cross section in the horizontal section plane, illustrating one embodiment of a component being modified as compared to the component in FIG. 1.

FIG. 7 by way of a vertical cross section through the semiconductor body 100 in the cross section plane C-C illustrates a further example of a transistor component. In this component the individual channel sections 15 are realized as pile-shaped sections; gate zone 13 is there realized as a ring-shaped zone around the pile-shaped channel section 15. These channel sections 15 and the gate zones 13 are illustrated in dashed-dotted-lines in FIG. 7. The shielding zones 21 that arranged below the channel sections 15 and the gate zones 13 in a vertical direction of the semiconductor body may be strip-shaped, as it is illustrated in FIG. 7. These gate zones 13 and the shielding zones 21 in this case have a different geometry or have different orientations in lateral directions, respectively. Individual sections of the ring-shaped gate zones 13 run perpendicular to the strip-shaped shielding zones.

Figure 8:
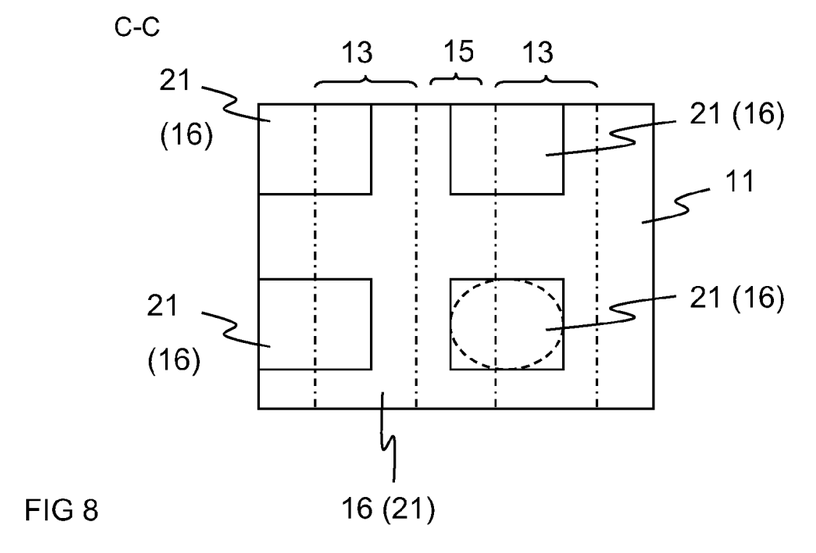
FIG. 8 is a cross section in the horizontal section plane, illustrating one embodiment of a component being modified as compared to the component in FIG. 1.

By way of a cross section through the semiconductor body 100 in the lateral section plain C-C FIG. 8 illustrates a further example of a transistor component, in which gate zone 13 and the shielding zones 21 have different geometries. In this transistor component channel zones 15 and gate zones 13 are strip-shaped zones having a longitudinal direction running in the lateral direction of the semiconductor body 100. These channel zones 15 and gate zones 13 are illustrated in dashed-dotted lines in FIG. 8. The shielding zones 21 that are arranged in a vertical direction below the channel zones 15 and the gate zones 13 in this component are insular-like semiconductor zones, that each may be connected to the gate zone 13. These insular-like shielding zones 21 in the illustrated lateral section plane C-C may be rectangular, and in one embodiment quadratic. However, these shielding zones may have any other geometry, and may, for example, be elliptic or circular. The section of the drift zone 11 that in the lateral direction is arranged between these shielding zones 21 in this transistor component has a grid-like geometry. As an alternative the shielding zone 21 is a grid-like zone. Such a structure is obtained, if in the component according to FIG. 8 the shielding zone 21 and the semiconductor zone 16 arranged in the spaces of the shielding zone, are interchanged, as it is illustrated by the reference signs given in brackets in FIG. 8.

Figure 9:
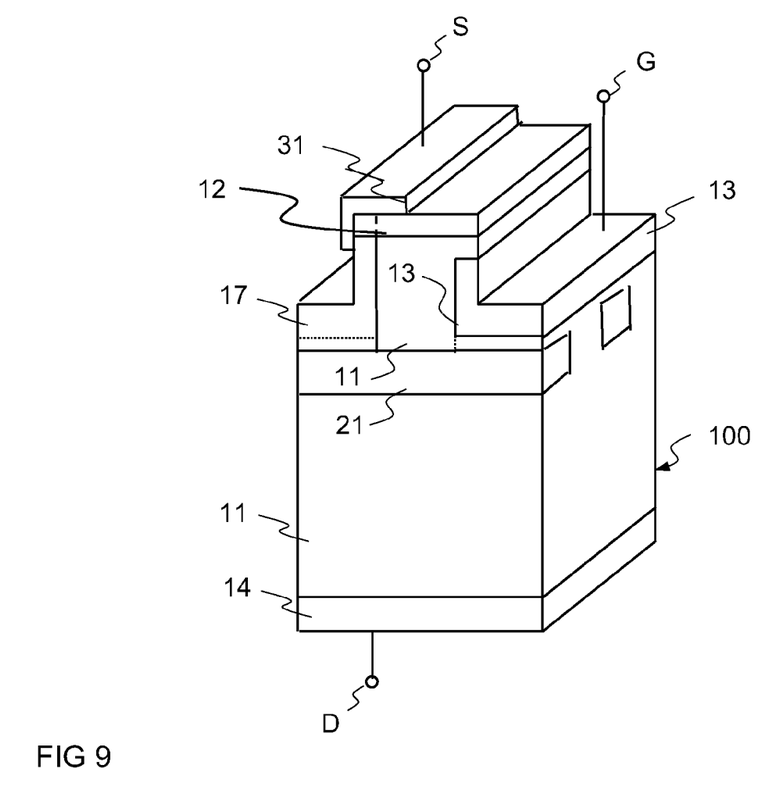
FIG. 9 is a perspective cross section through a semiconductor body of the transistor component, illustrating one embodiment of a second example of a transistor component being controllable using a junction effect.

In the embodiments illustrated, the control potential of the shielding structure is gate potential, this being obtained by connecting the shielding zones 21 of the shielding structure to the gate zone 13. Referring to FIG. 9 in a further example source potential is used as the shielding potential for the shielding zones 21. In this component a terminal zone 17 is arranged between the shielding zones 21 and the source electrode 31, which serves to connect the shielding zones 21 to the source electrode 31 at low resistance. In this connection terminal zone 17 is of the same conductivity type as the shielding zone 21, i.e., is of the second conductivity type. In the embodiment illustrated source zone 31 contacts terminal zone 16 at a side face of the head section. As illustrated in FIG. 9 in dashed lines terminal zone 16 is in one embodiment realized such that it reaches to the front side of the head section. Source zone 12 and terminal zone 16 in the region of the front side of the head section 13 may then commonly be contacted by source electrode 31. All the explanations that have been made so far concerning the geometry of the shielding zones 21 as well as concerning the geometry of the head section do correspondingly apply to the transistor component illustrated in FIG. 9. In this component drift zone 11, as well as shielding and terminal zones 21, 17, that are complementarily doped to drift zone 11, form a diode—being also referred to as body diode—between the source and the drain terminal S, D of the component. This body diode independent of controlling the gate terminal always allows a current flow in reverse direction of the component, i.e., in an n-conducting component a current flow is present at applying a positive voltage between source S and drain D, and in a p-conducting component a current flow is present at applying a negative voltage between source S and drain D.

In an alternative embodiment illustrated in dotted lines in FIG. 9 terminal zone 17 ends distant to the shielding zone 21 and gate zone 13 adjoins the shielding zone 21. The shielding potential in this case corresponds to gate potential. The terminal zones 17 connected to the source electrode 31 in this component only serves for realizing the body diode together with the drift zone 11.

Figure 10:
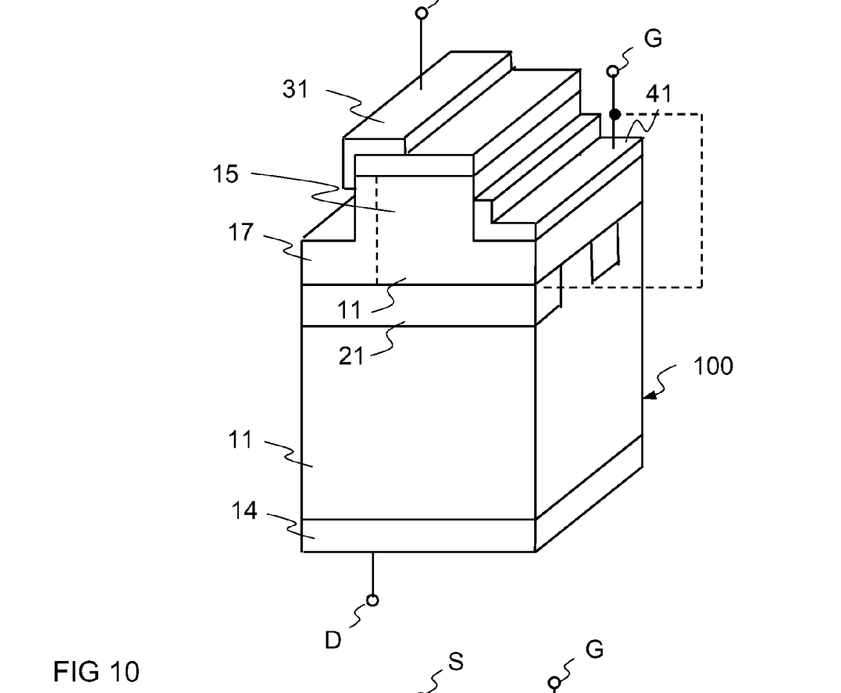
FIG. 10 is a perspective cross section through a semiconductor body of the transistor component, illustrating one embodiment of a third example of a transistor component being controllable using a junction effect.

FIG. 10 illustrates by way of a perspective cross section a further embodiment of a transistor component. This transistor component is realized as a MESFET, i.e., is different from the component illustrated above in that instead of a gate zone a Schottky metal zone is present that forms a Schottky junction with drift zone 11. Concerning the geometry of this Schottky metal zone 41 the above explanation concerning the gate zone apply correspondingly. The at least one gate zone 13 and the at least one Schottky metal zone 41 each form a control zone of the junction control structure. The shielding zones 21 may be connected to the Schottky metal zone 41, so that the shielding structure has gate potential. In one embodiment the shielding zones 21 may be connected to the source electrode 31, as explained in connection with FIG. 9. In this case the shielding structure has source potential. Concerning the geometry of the shielding structure of the component in FIG. 10 the above explanations concerning the shielding structure apply accordingly.

Figure 11:
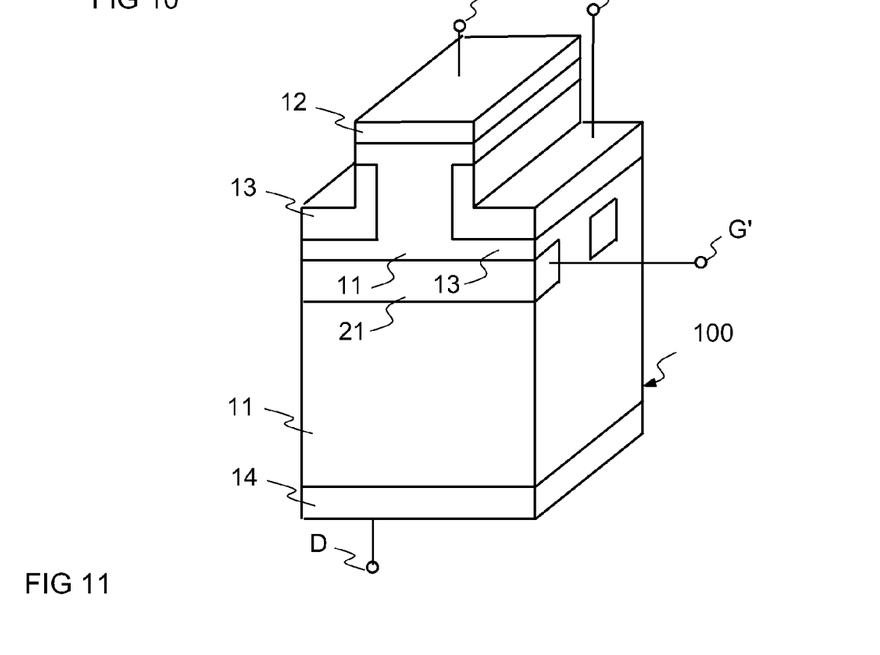
FIG. 11 is a perspective cross section through a semiconductor body of the transistor component, illustrating one embodiment of a fourth example of a transistor component being controllable using a junction effect.

Instead of connecting the shielding structure to gate potential or source potential this shielding structure may basically also be connected to any electrical potentials. This is schematically illustrated for a transistor component in FIG. 11. G' in FIG. 11 designates a schematically illustrated terminal of the shielding structure for applying any control potential. This control potential is, for example, an electrical potential that is between the gate potential and the source potential. The transistor component illustrated in FIG. 11 is a JFET, i.e., includes a gate zone 30 that forms a pn-junction with drift zone 11. In a manner not illustrated this component may also be a MESET, i.e., could include a Schottky junction instead of a pn-junction.

It should further be noted that features that have been explained in connection with one embodiment may be combined with features of other embodiments even in those cases in which this has not explicitly been mentioned.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor component, comprising:
   a source terminal, a drain terminal and control terminal;
   a source zone of a first conductivity type, connected to the source terminal;
   a drain zone of the first conductivity type, connected to the drain terminal;
   a drift zone arranged between the source zone and the drain zone;
   a junction control structure for controlling a junction zone in the drift zone between the drain zone and the source zone, at least comprising one control zone; and
   a shielding structure being arranged in the drift zone between the junction control structure and the drain zone and at least including a shielding zone of a second conductivity type being complementarily to the first conductivity type, the shielding zone being connected to a terminal for a shielding potential, and the at least one control zone and the at least one shielding zone have different geometries or different orientations in a plane that is perpendicular to a current flow direction of the component.

2. The transistor component of claim 1, comprising wherein the terminal for the shielding potential is the control terminal.

3. The transistor component of claim 1, comprising wherein the terminal for the shielding potential is the source terminal.

4. The transistor component of claim 1, comprising wherein the junction control structure includes a Schottky electrode as a control zone, the Schottky electrode being arranged in the drift zone in a region between the source zone and the shielding structure.

5. The transistor component of claim 1, comprising wherein the shielding structure is arranged closer to the source zone than the drain zone.

6. The transistor component of claim 1, comprising wherein the dimension of the at least one shielding zone in a current flow direction is smaller than 0.5 times the dimension of the drift zone in the current flow direction.

7. The transistor component of claim 1, comprising wherein the dimension of the at least one shielding zone in the current flow direction is smaller than 0.2 times the dimension of the drift zone in the current flow direction.

8. The transistor component of claim 1, comprising wherein the dimension of the at least one shielding zone in the current flow direction is between 0.5 µm and 1 µm.

9. The transistor component of claim 1, comprising wherein the at least one shielding zone is grid-shaped.

10. The transistor component of claim 1, comprising wherein the source zone is strip-shaped and includes an angle of more than 0° with the at least one shielding zone.

11. The transistor component of claim 1, comprising wherein a doping of the at least one shielding zone is so high that it is not completely depletable.

12. The transistor component of claim 1, comprising being realized as a vertical component in which the drain zone, the drift zone and the source zone are arranged adjacent to one another in a vertical direction of the semiconductor body.

13. The transistor component of claim 1, wherein a semiconductor body, in which the source zone, the drift zone and the drain zone are arranged, is comprised of SiC.

14. The transistor component of claim 1, comprising wherein the junction control structure includes a gate zone of the second conductivity type as control zone, the gate zone being connected to the control terminal and being arranged in the drift zone between the source zone and the shielding structure.

15. The transistor component of claim 14, comprising wherein the gate zone adjoins the shielding zone.

16. The transistor component of claim 1, comprising wherein the at least one shielding zone is strip-shaped.

17. The transistor component of claim 16, comprising wherein the at least one control zone is strip-shaped and includes an angle of more than 0° with the at least one shielding zone.

18. The transistor component of claim 16, comprising wherein the at least one control zone is grid-shaped.

19. The transistor component of claim 16, comprising wherein the at least one control zone is strip-shaped.

20. A transistor component, comprising:
    a source zone of a first conductivity type, being connected to the source terminal;
    a drain zone of the first conductivity type, being connected to the drain terminal;
    a drift zone arranged between the source zone and the drain zone;
    a junction control structure for controlling a junction zone in the drift zone between the drain zone and the source zone, at least comprising one control zone; and
    a shielding structure being arranged in the drift zone between the junction control structure and the drain zone and comprising at least one shielding zone of a second conductivity time being complementarily to the first conductivity type, the shielding zone and the control zone being coupled to a common terminal for a shielding potential.

21. The transistor component of claim 20, wherein the junction control structure includes a Schottky electrode as a control zone, the Schottky electrode being arranged in the drift zone in a region between the source zone and the shielding structure.

22. The transistor component of claim 20, wherein the shielding structure is arranged closer to the source zone than to the drain zone.

23. The transistor component of claim 20, wherein the dimension of the at least one shielding zone in a current flow direction is smaller than 0.5 times the dimension of the drift zone in the current flow direction.

24. The transistor component of claim 20, wherein the dimension of the at least one shielding zone in the current flow direction is smaller than 0.2 times the dimension of the drift zone in the current flow direction.

25. The transistor component of claim 20, wherein the dimension of the at least one shielding zone in the current flow direction is between 0.5 µm and 1 µm.

26. The transistor component of claim 20, wherein the at least one shielding zone is grid-shaped.

27. The transistor component of claim 20, wherein the source zone is strip-shaped and includes an angle of more than 0° with the at least one shielding zone.

28. The transistor component of claim 20, wherein a doping of the at least one shielding zone is so high that it is not completely depletable.

29. The transistor component of claim 20, comprising being realized as a vertical component in which the drain zone, the drift zone and the source zone are arranged adjacent to one another in a vertical direction of the semiconductor body.

30. The transistor component of claim 20, wherein a semiconductor body, in which the source zone, the drift zone and the drain zone are arranged, is comprised of SiC.

31. The transistor component of claim 20, wherein the junction control structure includes a gate zone of the second conductivity type as control zone, the gate zone being connected to the control terminal and being arranged in the drift zone between the source zone and the shielding structure.

32. The transistor component of claim 31, wherein the gate zone adjoins the shielding zone.

33. The transistor component of claim 20, wherein the at least one shielding zone is strip-shaped.

34. The transistor component of claim 33, wherein the at least one control zone is strip-shaped and includes an angle of more than 0° with the at least one shielding zone.

35. The transistor component of claim 33, wherein the at least one control zone is grid-shaped.

36. The transistor component of claim 33, wherein the at least one control zone is strip-shaped.

* * * * *